United States Patent
Chou et al.

(10) Patent No.: US 7,456,079 B2
(45) Date of Patent: Nov. 25, 2008

(54) EPI WAFER AND METHOD OF MAKING THE SAME

(75) Inventors: Hsueh-Liang Chou, Zhubei (TW); De-Fang Huang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 394 days.

(21) Appl. No.: 11/212,969

(22) Filed: Aug. 25, 2005

(65) Prior Publication Data
US 2007/0048974 A1    Mar. 1, 2007

(51) Int. Cl.
*H01L 21/76* (2006.01)

(52) U.S. Cl. ............... 438/401; 257/797; 257/E21.119; 438/462

(58) Field of Classification Search ................. 438/401, 438/462; 257/797, E21.119
See application file for complete search history.

(56) References Cited

U.S. PATENT DOCUMENTS 5,314,837 A * 5/1994 Barber et al. ............... 438/504
5,849,077 A * 12/1998 Kenney ....................... 117/90

* cited by examiner

*Primary Examiner*—Asok K Sarkar
(74) *Attorney, Agent, or Firm*—Tung & Associates

(57) ABSTRACT

A method including forming alignment marks in an upper surface of a semiconductor wafer; selectively depositing a mask over the alignment marks leaving portions of the upper surface exposed; depositing an epitaxial layer over the exposed portions of the upper surface; and thereafter removing the mask.

11 Claims, 6 Drawing Sheets

EPI WAFER AND METHOD OF MAKING THE SAME

FIELD OF THE INVENTION

The present invention relates to a semiconductor wafer having an epitaxial layer thereon and a method of making the same.

BACKGROUND OF THE INVENTION

Alignment marks and aligning wafers with respect to those marks are an important part of the process of manufacturing semiconductor devices and integrated circuits. Integrated circuits are manufactured by patterning a sequence of masking layers and the features on successive layers bear a spatial relationship to one another. As part of the manufacturing process each level must be aligned to the previous levels. Alignment of one pattern layer to previous layers is done with the assistance of special alignment patterns designed onto each mask level. When these special patterns are aligned, it is assumed that the remainder of the integrated circuit patterns are also correctly aligned. Since each layer must have alignment marks for proper registration with respect to the next layer, each alignment or registration then becomes layer dependent.

The tools that are used to pattern the various layers in a wafer are known as photomask or mask and reticles. The patterns on the mask or the reticle are defined by a combination of opaque and translucent areas. A light source shone through the mask or the reticle projects the pattern onto the surface of a semiconductor wafer, and depending upon the material that has been exposed to the light, the pattern is transferred onto the surface where the light arrives or where no light is shone on a semiconductor wafer surface. A mask contains patterns that can be transferred to an entire wafer in one exposure. A reticle, on the other hand, contains a pattern image that must be stepped and repeated in order to expose the entire semiconductor substrate surface.

The adjustments of the image of the mask being exposed to the previously produced patterns was originally performed by human operators, who compared the image locations under a microscope and adjusted the position of the mask to bring it into alignment with the wafer patterns. The decrease in feature sizes, and the increase in the number of alignments per wafer with step-and-repeat projector aligners, has been the impetus for developing automatic alignment systems.

Again, patterning is one of the basic steps used in performing semiconductor processing. It is also referred to as photolithography, masking, oxide or metal removal, and microlithography. Patterning enables the selective removal of material deposited on a semiconductor substrate or wafer (or removal of portions of the wafer), as a result of a deposition process. For example, as shown in FIG. 1A, a layer 104 has been deposited on a substrate 102. After the photolithography process is performed, as shown in FIG. 1B, some parts of layer 104 had been selectively removed, such that gaps 106a and 106b are present within the layer 104. A photomask, or pattern, is used (as shown in FIG. 1B) so that only the material from the gaps 106a and 106b are removed, and not the other portions of the layer 104. The process of adding layers and removing selected parts of them, in conjunction with other processes, permits the fabrication of semiconductor devices.

Again, alignment is critical in photolithography and deposition, as well as in other semiconductor processes. If layers are not deposited properly, or if they are not selectively removed properly, the resulting semiconductor devices may not function, and may be discarded as scrap. Such misalignment, or overlay shift, is shown in FIG. 2. The layer 204 may or may not be deposited in a properly aligned configuration on substrate 202, whereas subsequent deposition layers 206a, 206b, . . . , 206n are misaligned. This is indicated by the reference marks 210a, 210b, . . . , 210n, which are shown in FIG. 2 for illustrative clarity only. The reference marks 210a, 210b, . . . , 210n, should substantially align over the alignment marks 208 of the substrate 202, however, in this case the marks do not.

In comparison to FIG. 2, correctly aligned layers are shown in FIG. 3. The semiconductor wafer 202 has alignment marks 208. A layer 204 is aligned thereupon. Similarly the layers 206a, 206b, . . . , 206n are deposited upon the layer 204, without any, or with minimal, overlay shift. This is indicated by the reference marks 210a, 210b, 210n aligning with the alignment marks 208 of the wafer 202.

Specific type of alignment problems can result when using epitaxial layers grown over a semiconductor substrate. Epitaxy is the process in which a thin layer of a single crystal material is deposited on a substrate. Epitaxial growth occurs in such a way that the crystallographic structure of the substrate is reproduced in the growing material, although the conductivity and the doping level of the epitaxial layer can be independent of the underlying substrate layer. Silicon substrates with epitaxial layers are commonly used in complementary metal-oxide silicon (CMOS) semiconductor devices, bi-CMOS devices, high-voltage devices, and bipolar devices.

FIGS. 4A, 4B and 4C show the alignment problems that can occur within a pattern in an epitaxial layer relative to the pattern of a substrate layer. In FIG. 4A, pattern shift has occurred. The pattern 406 in a substrate layer 402 has shifted to the right as the pattern 408 in the epitaxial, or epi layer 404. In FIG. 4B, pattern distortion has occurred. The pattern 436 in the substrate layer 432 has become distorted as the pattern 438 in the epi layer 434. That is, the pattern 438 is smaller in width than the pattern 436. In FIG. 4C, pattern washout has occurred. The pattern 466 in the substrate layer 462 has washed out as the pattern 468 in the epi layer 464. These types of alignment problems can occur because of non-ideal deposition of the epi layers, and/or because of other improper processing. The patterns of FIGS. 4A, 4B and 4C can be alignment marks, used for alignment in the subsequent processing of epi layers and other layers.

Once the alignment problems of FIGS. 4A, 4B and 4C occur, adjustments must be made to the position of the features on subsequent layers in order to compensate for the areas induced in the epi layer. Selecting the correct amount of adjustment, however, is usually complicated by the fact that the effects are dependent on such varying factors as substrate orientation, deposition rate, deposition temperature, and silicon source. Further, in the case of pattern washout of FIG. 4C in particular, subsequent processing performed relative to the epi layer 464 will likely fail, because the semiconductor processing equipment will most likely not be able to align with the washout pattern 468. This alignment failure may be corrected by manual alignment that is time intensive and costly.

The present invention provides an alternative method of forming an epi layer on a semiconductor wafer.

SUMMARY OF THE INVENTION

One embodiment of the invention includes a method of selectively depositing an epitaxial material on selective portions of an upper surface of a semiconductor wafer leaving portions of the upper surface without the epitaxial material thereon.

Another embodiment of the invention includes a method of selectively forming a mask over portions of an upper surface of a semiconductor wafer leaving portions of the upper surface exposed; depositing an epitaxial material on the exposed portions of the upper surface; and thereafter removing the mask.

Another embodiment of the invention includes a method including forming alignment marks in an upper surface of a semiconductor wafer; selectively depositing a mask over the alignment marks leaving portions of the upper surface exposed; depositing an epitaxial material over the exposed portions of the upper surface; and thereafter removing the mask.

In another embodiment of the invention the mask comprises silicon dioxide.

In another embodiment of the invention the semiconductor wafer comprises silicon.

In another embodiment of the invention the epitaxial layer comprises silicon.

In another embodiment of the invention the depositing an epitaxial material comprises depositing silicon using chemical vapor deposition.

In another embodiment of the invention the depositing an epitaxial layer comprises chemical vapor deposition.

In another embodiment of the invention the depositing an epitaxial material comprises depositing silicon using chemical vapor deposition and a gas comprising at least one of silicon tetrachloride, silane, dichlorosilane and trichlorosilane.

In another embodiment of the invention the depositing an epitaxial material comprises metalorganic chemical vapor deposition.

In another embodiment of the invention the depositing an epitaxial material comprises a molecular-beam epitaxial process.

In another embodiment of the invention the upper surface includes alignment marks therein and wherein the epitaxial material is not deposited over the alignment marks.

In another embodiment of the invention the mask is formed over alignment marks in the upper surface of the semiconductor wafer prior to depositing an epitaxial material.

Other embodiments of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1A:
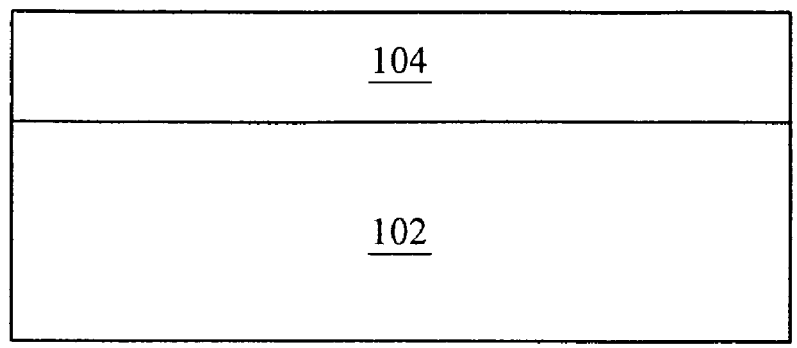
FIGS. 1A and 1B are diagrams showing the effective patterning of a layer deposited on a semiconductor wafer.
Figure 1B:
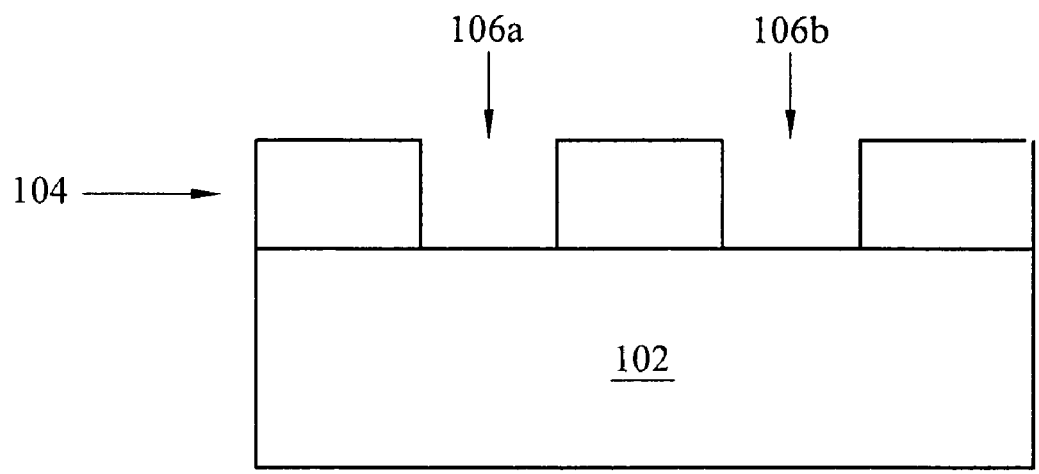
Figure 2:
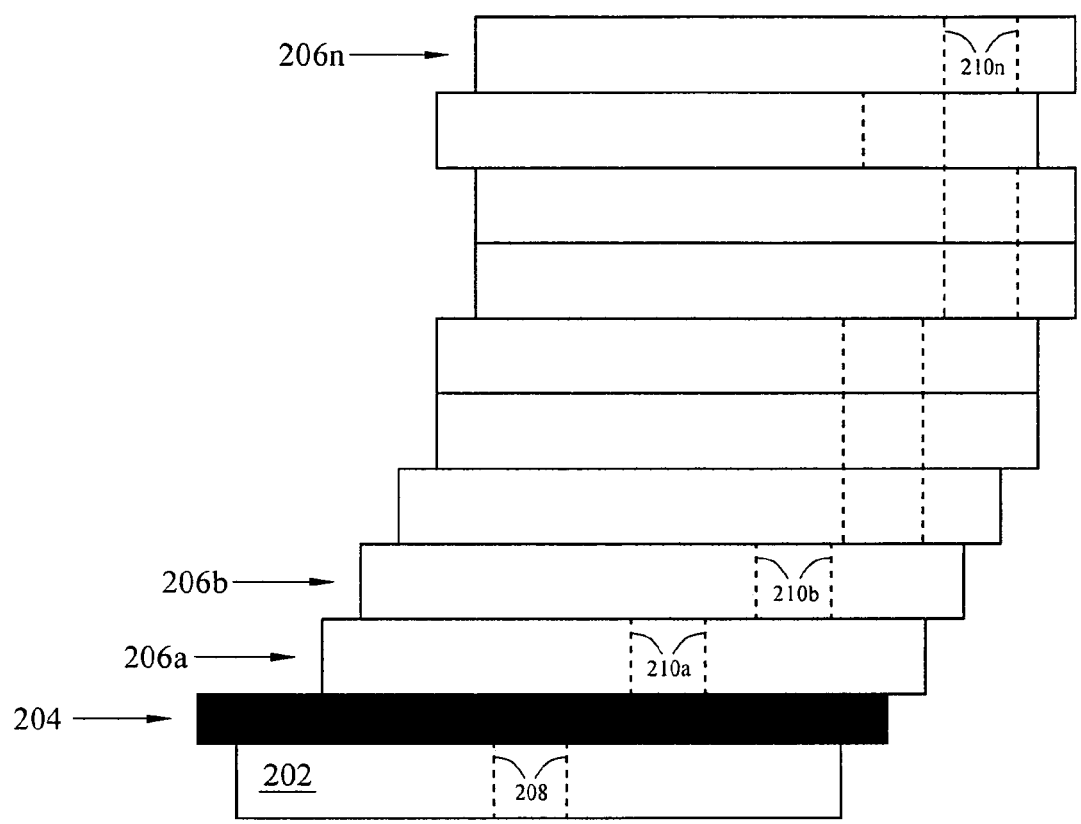
FIG. 2 is a diagram showing the overlay shift that results when depositing and exposing subsequent layers on a layer deposited on a semiconductor wafer.
Figure 3:
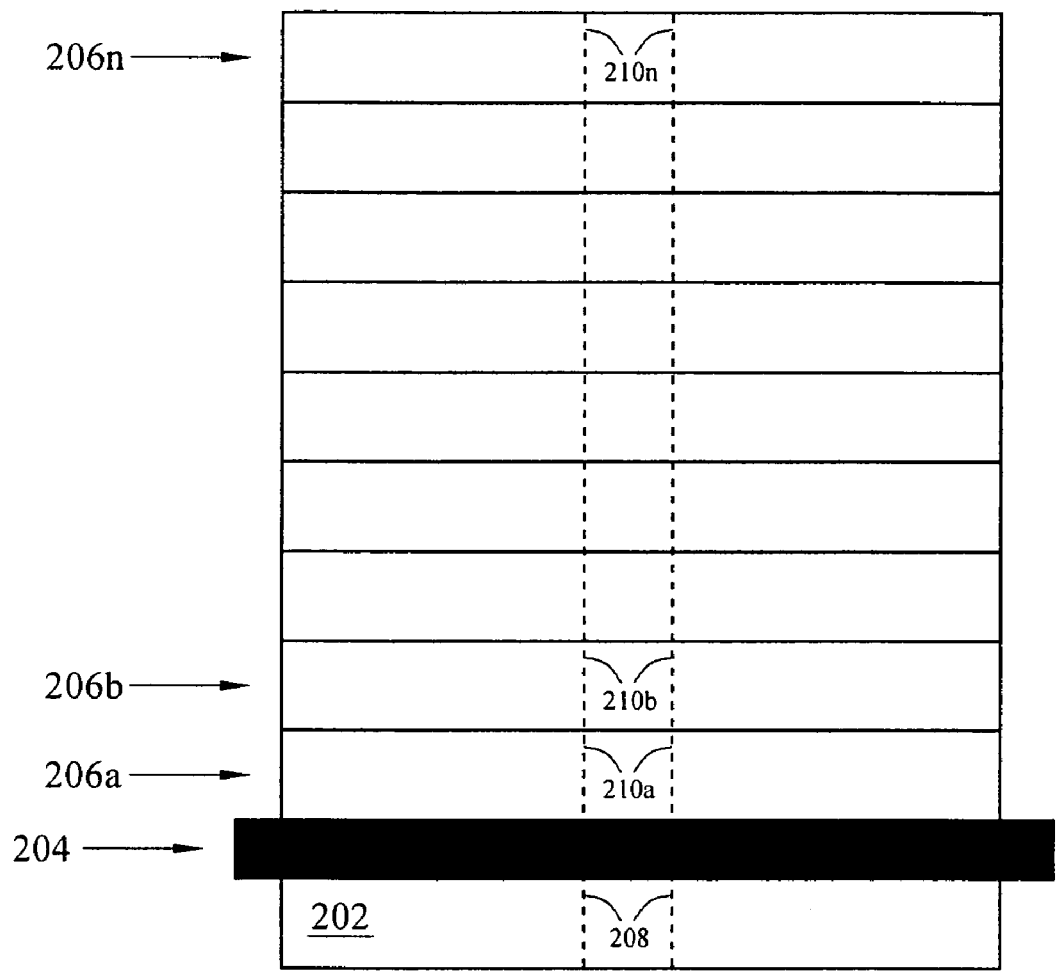
FIG. 3 is a diagram showing, in comparison to that of FIG. 2, how multiple deposits and exposed layers without overlay shift appear on a semiconductor wafer.
Figure 4A:
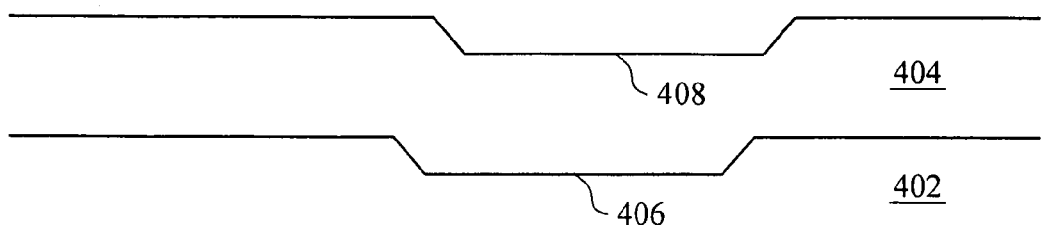
FIGS. 4A, 4B and 4C are diagrams of pattern shift, pattern distortion and pattern washout, respectively, that can problematically occur in epitaxial layers.
Figure 4B:
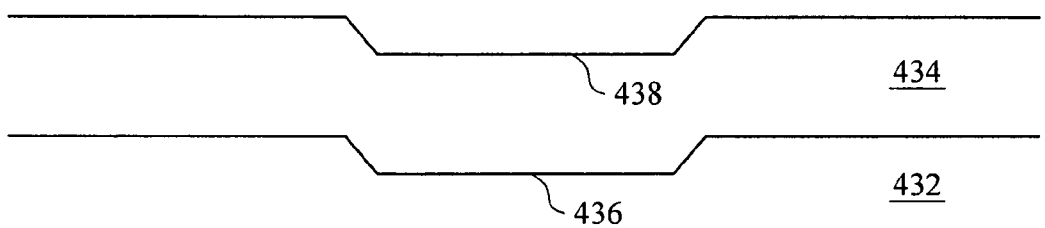
Figure 4C:
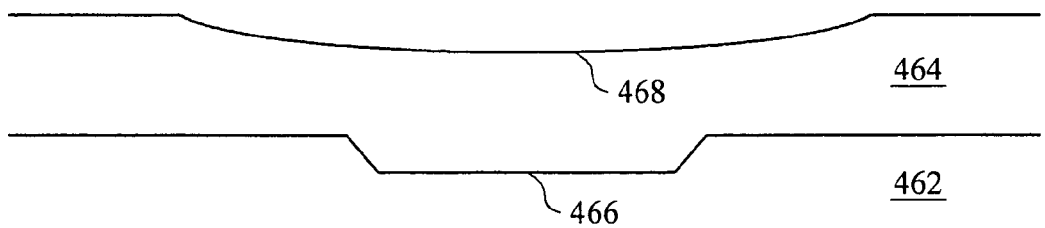
Figure 5A:
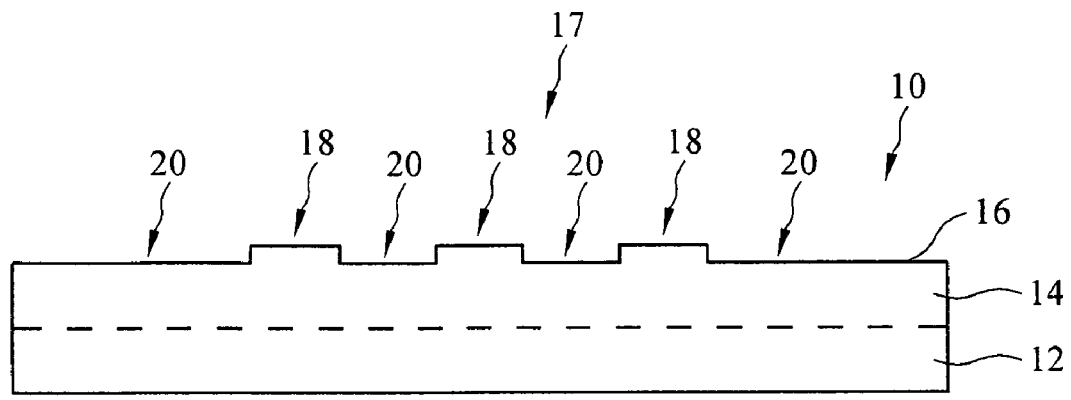
FIG. 5A illustrates a method according to the present invention including providing a semiconductor wafer including alignment marks on an upper surface thereof.

Referring now to FIG. 5A, one embodiment of the present invention includes providing a semiconductor wafer 10. The semiconductor wafer 10 may include any semiconductor material known to those skilled in the art including germanium and silicon. Alternative semiconductor materials may also be utilized including compound semiconductors formed from Group IIIA and Group VA of the periodic table (often referred to as III-V compounds). Including for example, gallium arsenide (GaAs). Further, other semiconductor compounds from elements found in Groups IIA and VIA may be utilized. The semiconductor wafer 10 includes an upper surface 16 in which or on which alignment marks 17 may be formed. The alignment marks 17 may include raised features 18 and channels 20. Typically the alignment marks 17 are formed by selectively etching portions of the semiconductor wafer to form the channels 20 leaving raised features 18 or islands. The semiconductor wafer may also include a plurality of dopants including, boron and phosphorus. The semiconductor wafer may also include a first region 12 and a second region 14 which may include a high dose of buried oxide. Alternatively, the alignment marks 17, in particularly the raised features 18, may be deposited on the semiconductor wafer 10.

Figure 5B:
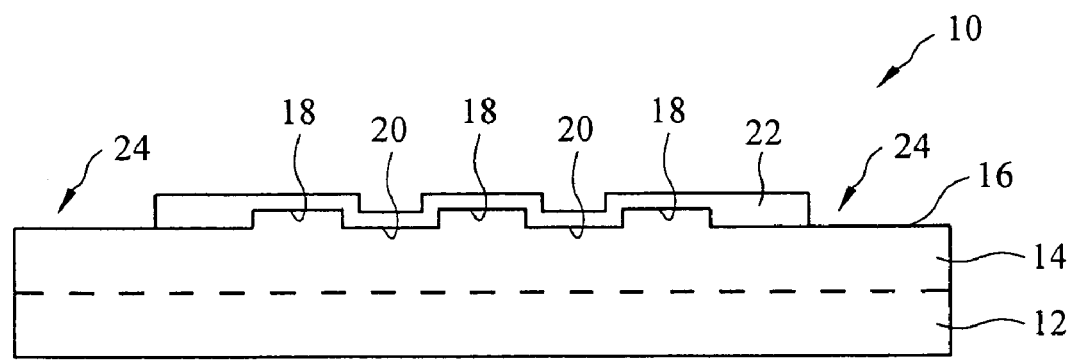
FIG. 5B illustrates a method according to the present invention including providing a mask, such as silicon dioxide, over portions of the upper surface of a semiconductor wafer including alignment marks and leaving portions of the upper surface of the semiconductor wafer exposed.

Referring now to FIG. 5B, one embodiment of the present invention includes providing a mask 22 selectively formed over portions of the upper surface 16 of a semiconductor wafer 10. Exposed portions 24 of the upper surface 16 are left without the mask 22 deposited thereon. Preferably the mask 22 covers the alignment mark 17 including the raised features 18 and channels 20. The mask 22 may include any material known to those skilled in the art including, but not limited to, silicon dioxide, silicon oxynitride and photoresist materials.

Figure 5C:
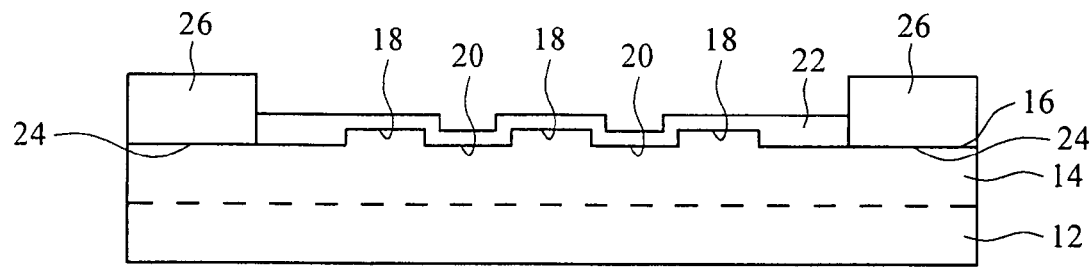
FIG. 5C illustrates one embodiment of the present invention including depositing an epitaxial layer over the exposed portions of the upper surface of a semiconductor wafer.

Referring now to FIG. 5C, an epitaxial material 26 is deposited over the exposed regions 24 of the upper surface 16 of the semiconductor wafer 10. For example, the semiconductor wafer 10 may include silicon that is used as a seed crystal to grow a thin layer of silicon (epitaxial layer) on the semiconductor wafer 10. A crystal structure of the new epitaxial layer 26 will duplicate that of the semiconductor wafer 10. Since the substrate wafer 10 is monocrystal, the epitaxial layer 26 is monocrystal. Further, the dopant of the epitaxial layer can be n-type or p-type and is independent of the initial wafer dopant type. For example, it is possible to grow a p-type epitaxial layer 26 on a p-type wafer with a lower concentration of electrically active dopant in the epitaxial layer than what was found on the wafer 10. The epitaxial layer 26 provides flexibility for device design in order to optimize performance by controlling the epi layer, doping thickness, concentration and profile, independent of the semiconductor wafer 10. This control is accomplished by the intentional addition of dopants during the epitaxial growth process. The epi layer also reduces the occurrence of latchup in CMOS devices. The epitaxial layer 26 may be formed by methods including chemical vapor deposition. Before the epitaxial growth, the wafer 10 may be cleaned of oxide and any residual organic or metal impurities. In one embodiment of the invention, possible gas sources for the epitaxy reaction are the hydrogen reduction of silicon tetrachloride ($SiCl_4$), silane ($SiH_4$), dichlorosilane ($SiH_2Cl_2$) or trichlorosilane. In one embodiment of the invention, deposition temperatures may range from 1050°-1250° C. In one embodiment of the invention, different epitaxial growth methods may also be used to grow single-crystal epitaxial layers on the silicon wafer 10 including solid-phase, liquid-phase, vapor-phase, and molecular I-beam epitaxy. In one embodiment of the invention, the growing of an epitaxial layer on the silicon wafer may be accomplished by one of vapor-phase epitaxy, metalorganic chemical vapor deposition, and molecular-beam epitaxy methods.

Figure 5D:
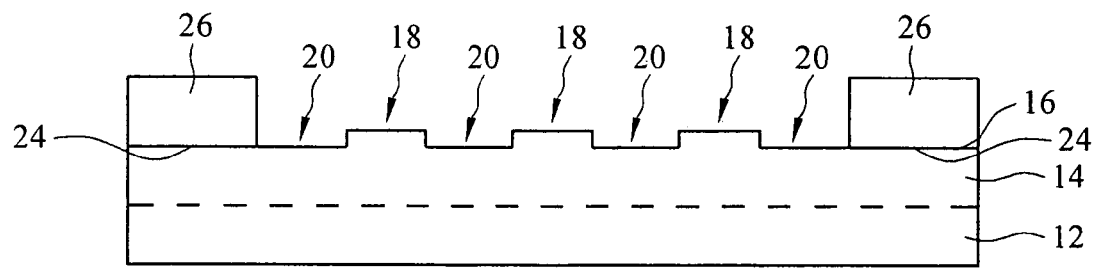
FIG. 5D illustrates one embodiment according to the present invention including removing the mask from the structure shown in FIG. 5C.

Referring now to FIG. 5D, after the epitaxial material or layer 26 has been deposited, the mask 22 is removed for example by etching.

The description of the invention is merely exemplary in nature and, thus, variations that do not substantially depart from above description are intended to be within the scope of the invention. Such variations are not to be regarded as a departure from the spirit and scope of the invention.

What is claimed is:

1. A method for forming an epitaxial layer while protecting alignment marks with a mask comprising:
   forming alignment marks comprising a semiconductor wafer;
   forming a mask over said alignment marks leaving portions of the upper surface of said semiconductor water exposed;
   depositing an epitaxial material on the exposed portions of the upper surface; and
   thereafter removing the mask to expose said alignment marks for subsequent alignment of said wafer in subsequent processing.

2. A method as set forth in claim 1 wherein the semiconductor wafer comprises silicon.

3. A method as set forth in claim 2 wherein the epitaxial layer comprises silicon.

4. A method as set forth in claim 1 wherein the depositing an epitaxial material comprises at least one of depositing silicon using chemical vapor deposition, a metalorganic chemical vapor deposition, and a molecular-beam epitaxial process.

5. A method as set forth in claim 1 wherein the depositing an epitaxial layer comprises chemical vapor deposition.

6. A method as set forth in claim 1 wherein the depositing an epitaxial material comprises depositing silicon using chemical vapor deposition and a gas comprising at least one of silicon tetrachloride, silane, dichlorosilane and trichlorosilane.

7. A method as set forth in claim 1 wherein the mask comprises silicon dioxide.

8. The method as set forth in claim 1 wherein said epitaxial material has a doping concentration different than said semiconductor wafer.

9. A method for forming an epitaxial layer while protecting alignment marks with a mask comprising:
   forming alignment marks in an upper surface of a semiconductor wafer;
   selectively depositing a mask over the alignment marks leaving portions of the upper surface exposed;
   depositing an epitaxial material over the exposed portions of the upper surface; and
   thereafter removing the mask to expose said alignment marks for subsequent alignment of said wafer in subsequent processing.

10. A method as set forth in claim 9 wherein the mask comprises silicon dioxide.

11. The method as set forth in claim 9 wherein said epitaxial material has a doping concentration different than said semiconductor wafer.

* * * * *